United States Patent [19]
Canella et al.

[11] Patent Number: 5,528,603
[45] Date of Patent: Jun. 18, 1996

[54] APPARATUS AND METHOD FOR TESTING AN INTEGRATED CIRCUIT USING A VOLTAGE REFERENCE POTENTIAL AND A REFERENCE INTEGRATED CIRCUIT

[75] Inventors: Robert L. Canella, Meridian; Greg D. Stevenson; Dave E. Charlton, both of Boise; Scott A. Earnest, Nampa, all of Id.

[73] Assignee: Micron Technology, Inc., Boise, Id.

[21] Appl. No.: 431,952

[22] Filed: May 1, 1995

[51] Int. Cl.$^6$ .................................................. G06F 11/26
[52] U.S. Cl. ............................................ 371/25.1; 371/21.2
[58] Field of Search .................................. 371/8.1, 6, 16.1, 371/16.2, 21.2, 22.1, 22.5

[56] References Cited

U.S. PATENT DOCUMENTS

| | | | |
|---|---|---|---|
| 4,414,665 | 11/1983 | Kimura et al. | 371/5.1 |
| 4,479,214 | 10/1984 | Ryan | 371/11 |
| 4,635,258 | 1/1987 | Salowe | 371/62 |
| 4,942,576 | 7/1990 | Busach et al. | 371/21.2 |
| 5,233,614 | 8/1993 | Singh | 371/21.6 |
| 5,337,318 | 8/1994 | Tsukakoshi | 371/5.1 |

OTHER PUBLICATIONS

*Microprocessors and Programmed Logic*, Second Edition by Kenneth L. Short ©1987 by Prentice–Hall, Inc. pp. 103–108.
*Electric Circuit Design*, Savant et al. 1987, The Benjamin/Cummings Publishing Company, Inc. pp. 324–326 & pp. 580–650.

*Primary Examiner*—Vincent P. Canney
*Attorney, Agent, or Firm*—Susan B. Collier

[57] ABSTRACT

An integrated circuit testing apparatus and method of testing. In a first embodiment an amplifier amplifies the difference in a reference integrated circuit (RIC) response and a device under test integrated circuit (DUTIC) response to an electrical stimulus. The electrical stimulus is provided at an input of the DUTIC and the RIC by a stimulus circuit. A analog comparator determines when the amplified differences exceeds an adjustable threshold value. The sensitivity of the comparator is adjustable and the desired threshold value is adjusted before testing begins. If the amplified difference exceeds the threshold value of the comparator an error signal is generated. The apparatus of the invention includes a presetable counter which generates a device fail signal if a predetermined number of error signals are generated by the comparator. An initialization circuit loads a selectable value into the counter to provide a variable number of allowable errors before a DUTIC fails the test. In a second embodiment a precision voltage reference potential is adjusted to select a desired minimum potential for a high logic signal and a desired maximum potential for a low logic signal. The integrated circuit testing apparatus of the second embodiment also utilizes a RIC. The DUTIC and the RIC respond to the same electrical stimulus. The responses of the DUTIC and the RIC to the electrical stimulus are compared. If the responses have different logic levels the DUTIC automatically fails the test. If the responses have the same logic levels, the test circuit then compares the value of the DUTIC response to the minimum and maximum potentials of the precision voltage reference potential. If the DUTIC response does not lie either above or below the desired minimum and maximum potentials, respectively, the DUTIC fails the test since its potential falls within a failure window lying between the desired minimum and maximum values. Conversely if the DUTIC response falls above or below either of the desired minimum or maximum values, respectively, and has the same logic state as the RIC the DUTIC passes the test.

23 Claims, 2 Drawing Sheets

— 5,528,603 —

APPARATUS AND METHOD FOR TESTING AN INTEGRATED CIRCUIT USING A VOLTAGE REFERENCE POTENTIAL AND A REFERENCE INTEGRATED CIRCUIT

The present application is a continuation-in-part of a parent application entitled "An IC Selectable Failure Count Testing Device with an Analog Comparator" filed on Jan. 13, 1993 and having Ser. No. 08/003,902. The inventors of this parent application are Robert L. Canella, Greg D. Stevenson, Dave E. Charlton, and Scott A. Earnest.

FIELD OF THE INVENTION

The invention relates to an apparatus and method for testing integrated circuits.

SUMMARY OF THE INVENTION

The invention is an integrated circuit testing apparatus and method of testing.

In a first embodiment an amplifier amplifies the difference in a reference integrated circuit (RIC) response and a device under test integrated circuit (DUTIC) response to an electrical stimulus. The electrical stimulus is provided at an input of the DUTIC and the RIC by a stimulus circuit. A analog comparator determines when the amplified differences exceeds an adjustable threshold value. The sensitivity of the comparator is adjustable and the desired threshold value is adjusted before testing begins. If the amplified difference exceeds the threshold value of the comparator an error signal is generated. The apparatus of the invention includes a presetable counter which generates a device fail signal if a predetermined number of error signals are generated by the comparator. An initialization circuit loads a selectable value into the counter to provide a variable number of allowable errors before a DUTIC fails the test. A latch circuit latches the device fail signal generated by the counter.

In a second embodiment a precision voltage reference potential is adjusted to select a desired minimum potential for a high logic signal and a desired maximum potential for a low logic signal. The integrated circuit testing apparatus this second embodiment also utilizes a RIC. The DUTIC and the RIC respond to the same electrical stimulus. The responses of the DUTIC and the RIC to the electrical stimulus are compared. If the responses have different logic levels the DUTIC automatically fails the test. If the responses have the same logic levels, the test circuit then compares the value of the DUTIC response to the minimum and maximum potentials of the precision voltage reference potential. If the DUTIC response does not lie either above or below the desired minimum and maximum potentials, respectively, the DUTIC fails the test since its potential falls within a failure window lying between the desired minimum and maximum values. On the other hand if the DUTIC response falls above or below either of the desired minimum or maximum values, respectively, and has the same logic state as the RIC the DUTIC passes the test.

DETAILED DESCRIPTION OF THE INVENTION

The inventions is an integrated circuit testing apparatus and method of testing.

Figure 1:
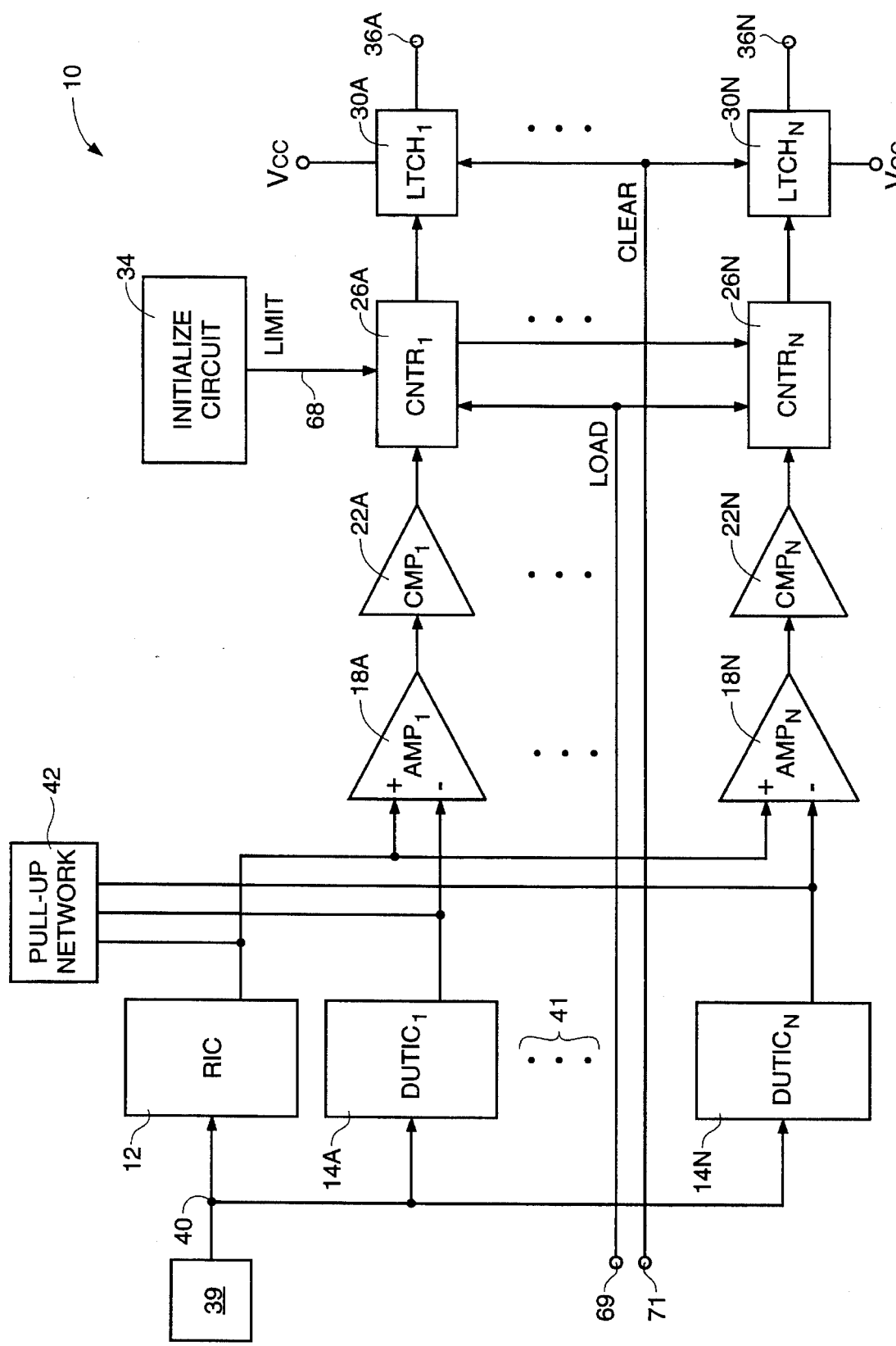
FIG. 1 is a schematic of a first embodiment of the invention.

A first embodiment is shown schematically in FIG. 1. The invention shown in FIG. 1 depicts the parallel testing of several device under test integrated circuits (DUTICs) 14A–14N. An amplifier 18A–18N amplifies the difference in the RIC 12 response and the DUTIC 14A–14N response to an electrical stimulus. The electrical stimulus is provided at an input of the DUTIC 14A–14N and the RIC 12 by a stimulus circuit 39. The RIC 12 is selected to have a desired response to the electrical stimulus. A analog comparator 22A–22N determines when the amplified differences exceeds an adjustable threshold value. The sensitivity of each comparator 22A–22N is adjustable and the desired threshold value is adjusted before testing begins. If the amplified difference exceeds the threshold value of the comparator an error signal is generated. The apparatus of the invention includes a presetable counter 26A–26N which generates a device fail signal if a predetermined number of error signals are generated by the comparator 22A–22N. An initialization circuit 34 loads a selectable value into the counter 26A–26N to provide a variable number of allowable errors before a DUTIC 14A–14N fails the test. Latch circuit 30A–30N latches the device fail signal generated by the counter 26A–26N.

In a second embodiment of the invention allows the user to detect proper output voltage levels at a high rate of speed, between 5–10 ns. Former circuits may have passed a high voltage of 2 volts when current specifications called for the minimum high voltage to be 2.5 volts. The circuit of the invention quickly tests the DUTIC to determine if its response to an electrical stimulus actually meets a desired maximum or minimum potential for the appropriate logic level.

In this second embodiment a precision voltage reference potential is adjusted to select a desired minimum potential for a high logic signal and a desired maximum potential for a low logic signal. The integrated circuit testing apparatus this second embodiment also utilizes a RIC. The DUTIC and the RIC respond to the same electrical stimulus. The responses of the DUTIC and the RIC to the electrical stimulus are compared. If the responses have different logic levels the DUTIC automatically fails the test. If the responses have the same logic levels, the test circuit then compares the value of the DUTIC response to the minimum and maximum potentials of the precision voltage reference potential. If the DUTIC response does not lie either above or below the desired minimum and maximum potentials, respectively, the DUTIC fails the test since its potential falls within a failure window lying between the desired minimum and maximum values. On the other hand if the DUTIC response falls above or below either of the desired minimum or maximum values, respectively, and has the same logic state as the RIC the DUTIC passes the test.

It is possible to use the test circuit for multiple tests on the DUTIC. In this case each response of the DUTIC to a specific test stimulus is compared to a corresponding response of the RIC to the same test stimulus. It is then possible to utilize a counter circuit to count the number of specific tests failed by the DUTIC.

Figure 2:
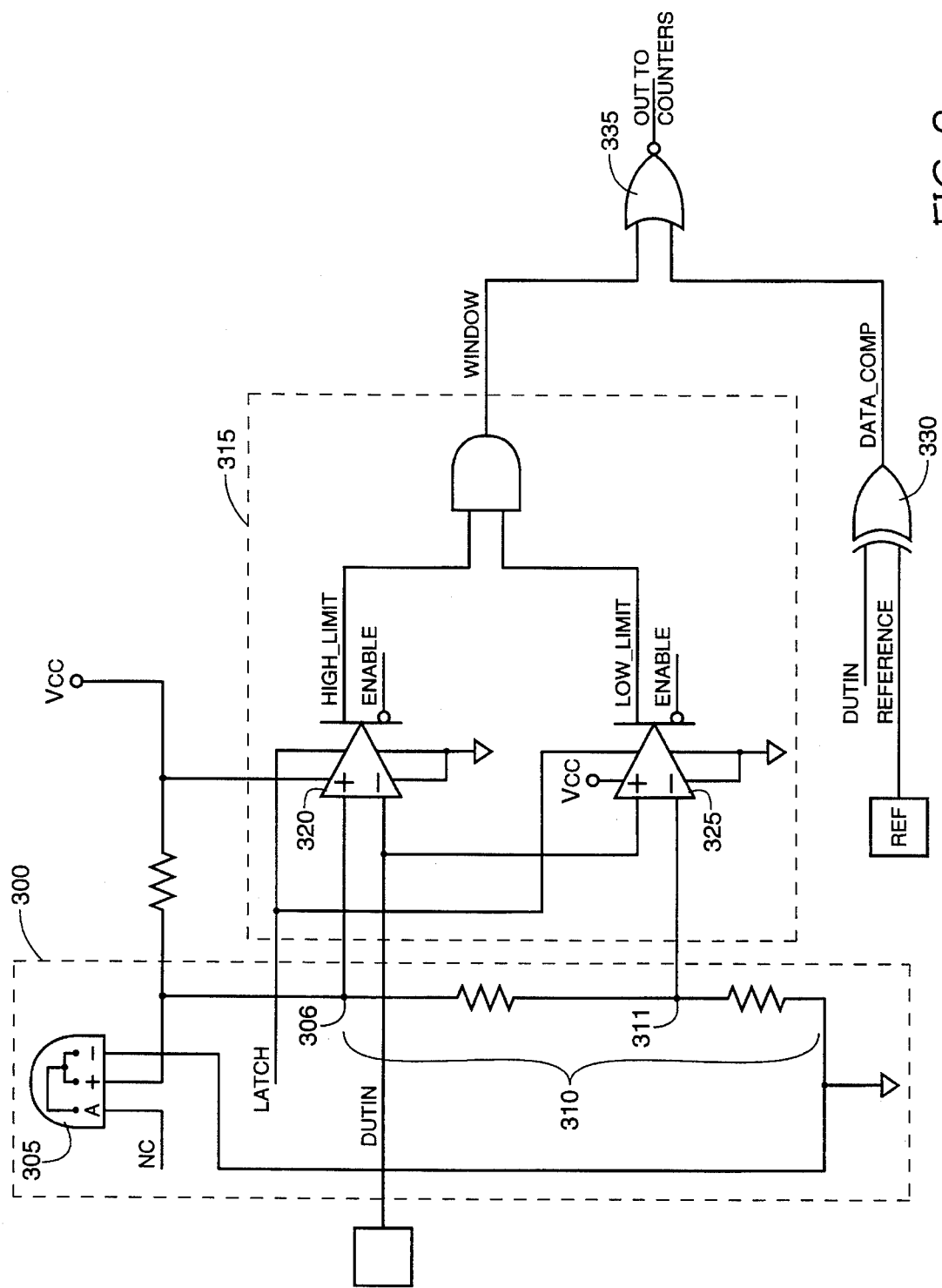
FIG. 2 is a schematic of a second embodiment of the invention.

FIG. 2 is one test circuit of the invention. A window voltage reference circuit 300 is presetable to set the limiting voltages of the failure window. The supply potential of the window voltage reference circuit 300 is a precision supply circuit 305 which is capable of providing a voltage at a presetable precise level. In this embodiment the precision supply circuit 305 is adjusted to the desired minimum potential of the high logic level at node 306. A voltage divider circuit 310 is adjustable to determine the maximum potential of the low logic level at node 311.

A comparator circuit 315 is used to compare the DUTIC response to the reference potentials set by the window voltage reference circuit 300. A first operational amplifier 320 compares the DUTIC response to the minimum potential set by the window voltage reference circuit 300, and a second operational amplifier 325 compares the DUTIC response to the maximum potential set by the window voltage reference circuit 300. A LT1016 may be selected as the operational amplifiers because of its high speed capabilities. When the outputs of both operational amplifiers 320 and 325 indicate that the DUTIC response falls within the failure window the DUTIC fails the circuit test. However, if the output signal of one of the operational amplifiers 320 and 325 indicates that the DUTIC response is not in the failure window the DUTIC passes the test if the RIC and the DUTIC response to the same electrical stimuli are a logic match.

A response of the DUTIC and a RIC are compared in exclusive or gate 330. If the responses have different logic states the DUTIC immediately fails the test. This failure is indicated by a logic high at the output of exclusive OR gate 330. The logic high is an input to a NOR gate 335 which generates a logic low in response to the logic high input. The logic low on the output node of the NOR gate 335 indicates a bad bit.

In the case where the DUTIC and RIC response match, either both a logic high or both a logic low, the exclusive XOR 330 generates a logic low. The logic low enables the NOR gate 335. However, if the DUTIC response falls in the fail window the comparator circuit 315 generates a logic high to a second input node of the enabled NOR gate 335, and the NOR gate 335 generates a logic low (test failed). On the other hand, if the DUTIC response is not inside the fail window, the comparator 315 generates a logic low to the second input of the enabled NOR gate 335, and the enabled NOR gate 335 generates a logic high (test passed).

It is possible for one skilled in the art to add clocking circuitry and latch circuitry without departing from the spirit and scope of the invention. In addition other enhancements may be used in place of the presently described components. For example, serially programmable digital analog counters(DACs) may provide the voltage reference levels at the comparator inputs. In the case where there are no signal lines available for DAC programming, switches can be used to increment parallel loaded DACs by predetermined amounts, such as 0.1 volt per switch a programmable logic device may also be used in a counter section to reduce the number of devices used.

In a more elaborate scheme, two comparator circuits may be used. In this case the first comparator circuit ascertains whether the DUTIC response falls within a high window, i.e. between 2.5 volts and 5 volts, and the second comparator circuit ascertains whether the DUTIC response falls within a logic low window, i.e. between 1.5 and 0 volts. When the DUTIC response falls within either window and the reference circuit and DUTIC have matching logic states the DUTIC passes the circuit test. However, if the DUTIC response falls outside both the high and low windows or if the reference circuit and the DUTIC have mismatched responses the DUTIC fails the circuit test.

What is claimed is:

1. A test circuit for comparing responses of a device under test integrated circuit (DUTIC) and a reference integrated circuit (RIC) to an electrical stimulus in order to determine whether the DUTIC passes a circuit test function, comprising:

a) a first circuit portion configured to amplify a difference in potential between the DUTIC response and the RIC response to the electrical stimulus; and b) a second circuit portion configured to receive the amplified difference in potential from the first circuit portion and to compare the amplified difference in potential to a presetable potential, said second circuit portion generating a failure signal when said amplified difference in potential exceeds the presetable potential.

2. The test circuit as specified in claim 1, further comprising a counter circuit for counting a number of failure signals.

3. The test circuit as specified in claim 2, further comprising an initializing circuit for initializing the counter to a designated umber of counts such that the counter creates an active output signal after receiving the designated number of counts, the active output signal indicating a failure for the DUTIC.

4. An apparatus for testing an electrical function of a device under test integrated circuit (DUTIC), comprising:

a) a stimulus portion configured to provide an electrical stimulus signal to the DUTIC and to a reference integrated circuit (RIC), wherein the DUTIC is configured to generate a DUT response to the electrical stimulus and wherein the RIC is configured to generate a RIC response to the electrical stimulus, and wherein the RIC response has a desired logic level;

b) a first circuit portion configured to receive the DUT response and the RIC response and to generate a proportional signal proportional to a difference between the DUT response and the RIC response; and c) a second circuit portion having an adjusted threshold value wherein the second circuit portion generates an error signal when the proportional signal exceeds the threshold value.

5. The apparatus as specified in claim 4, further comprising a presetable counter in electrical communication with an output node of said second circuit portion, the error signal available at the output node of said second circuit portion, said presetable counter configured to count a number of times the error signal occurs and to generate a device fail signal when said number reaches a predetermined value.

6. The apparatus as specified in claim 4, wherein both said RIC response and said DUT response are negative.

7. The apparatus as specified in claim 4, wherein both said RIC response and said DUT response are positive.

8. The apparatus as specified in claim 4, wherein said RIC response and said DUT response have different polarities.

9. An apparatus for testing a device under test integrated circuit (DUTIC), comprising:

a) a voltage reference circuit configured to provide a first voltage reference potential and a second voltage reference potential, wherein a range of potentials falling between the first voltage reference potential and the second voltage reference potential define a window; and b) a logic circuit configured to determine when a DUTIC output potential falls within the window.

10. An apparatus for testing a device under test integrated circuit, comprising:

a) a stimulus portion configured to electrically stimulate the DUTIC, the DUTIC generating an output potential when stimulated;

b) a first circuit portion having a high limit potential and a low limit potential, the high and low limit potentials defining a first window;

c) a second circuit portion having a high limit potential and a low limit potential, the high and the low limit potentials of the second circuit portion defining a second window; and d) a logic circuit configured to provide a first signal when the DUTIC output potential is within one of the first and the second windows and to provide a second signal when DUTIC output potential falls outside the first and the second windows.

11. The apparatus as specified in claim 10, wherein:

a) said stimulus portion stimulates a reference circuit which generates a reference output potential when stimulated; and comprising b) a further logic circuit configured to provide a fail signal when the reference output potential and the DUTIC output potential have different logic levels and to provide a fail signal when said logic circuit provides the second signal, and wherein said further logic circuit generates a pass signal when the reference output potential and the DUTIC output potential have a same logic level and when the logic circuit provides the first signal.

12. An apparatus for testing a device under test integrated circuit (DUTIC), comprising:

a) a voltage reference circuit configured to provide a first voltage reference potential and a second voltage reference potential, wherein a range of potentials falling between the first voltage reference potential and the second voltage reference potential define a window; and b) a comparator circuit configured to compare a DUTIC output potential to the first and the second voltage reference potentials, the DUTIC output potential generated in response to an electrical input stimulus, said comparator circuit determining when the DUTIC output potential falls within the window and determining when the DUTIC output potential falls outside of the window, said comparator circuit generating a pass signal when the DUTIC output potential falls outside of the window.

13. An apparatus for testing a device under test integrated circuit (DUTIC), comprising:

a) a voltage reference circuit configured to provide a first voltage reference potential and a second voltage reference potential, wherein a range of potentials interposed between the first voltage reference potential and the second voltage reference potential define a window; and b) a comparator circuit configured to compare a DUTIC output potential to the first and the second voltage reference potentials, the DUTIC output potential generated in response to an electrical input stimulus, said comparator circuit determining when a first condition is present, the first condition defined as the DUTIC output potential being less than the first voltage reference potential and greater than the second voltage reference potential, and said comparator circuit determining when a second condition is present, the second condition defined as at least the DUTIC output potential being greater than the first voltage reference potential or being less than the second voltage reference potential, said comparator circuit generating a passing signal when the second condition is met and generating a failure signal when said first condition is met.

14. The apparatus as specified in claim 13, further comprising a matching circuit configured to match a logic state of a reference output potential and a logic state of the DUTIC output potential, the reference output potential generated in a reference integrated circuit in response to the electrical input stimulus, the reference integrated circuit selected to have a desired output in response to the electrical input stimulus, said matching circuit generating a data match signal when the DUTIC output potential and the reference output potential have a same logic state and generating a data mismatch signal when the DUTIC output potential and the reference output potential have different logic states.

15. The apparatus as specified in claim 14, further comprising a logic circuit configured to generate a DUTIC fail signal when said matching circuit generates a data mismatch signal or when said comparator circuit generates the failure signal.

16. The apparatus as specified in claim 14, further comprising a logic circuit configured to generate a DUTIC pass signal when said matching circuit generates a data match signal and when said comparator circuit generates the passing signal.

17. The apparatus as specified in claim 13, wherein said comparator circuit comprises:

a) a first operational amplifier configured to compare the first voltage reference potential to the DUTIC output potential, said first operational amplifier generating the passing signal when the DUTIC potential is greater than the first voltage reference potential; and b) a second operational amplifier configured to compare the second voltage reference potential to the DUTIC output potential, said second operational amplifier generating the passing signal when the DUTIC output potential is less than the second voltage reference potential.

18. An apparatus for testing a device under test integrated circuit (DUTIC), comprising:

a) a circuit configured to define a first window of potentials;

b) a circuit configured to define a second window of potentials;

c) a circuit configured to stimulate the DUTIC with an electrical stimulus; and d) a circuit configured to compare the potentials defined by the first and second windows to a potential of a DUTIC response to the electrical stimulus, said circuit configured to compare generating a pass signal when the potential of the DUTIC response falls within one of the first and the second windows.

19. A method for testing an integrated circuit, comprising the following steps:

a) stimulating the integrated circuit to be tested with an electrical stimulus;

b) generating an output potential from the integrated circuit in response to the electrical stimulus;

c) stimulating a reference circuit with the electrical stimulus;

d) generating an output potential from the reference circuit in response to the electrical stimulus;

e) creating a proportional potential which is proportional to a difference in potential between the output potential from the integrated circuit and the output potential from the reference circuit; and f) comparing the proportional potential and a presetable potential to determine if the proportional potential exceeds the presetable potential.

20. The method as specified in claim 19, further comprising the step of generating a failure signal when the proportional potential exceeds the presetable potential.

21. The method as specified in claim 20, further comprising the following steps:

a) initializing a counter;
  b) counting a number of failure signals; and
  c) generating a device fail signal when the counter increments in response to the number of failure signals.

22. A method for electrically testing a circuit under test, comprising the following steps:

a) initializing a test circuit to a selectable limit of failures:
  b) electrically stimulating a reference circuit;
  c) generating a reference circuit output potential in response to said step of stimulating the reference circuit;
  d) electrically stimulating the circuit under test;
  e) generating a circuit under test output potential in response to said step of stimulating the circuit under test;
  f) amplifying a difference between said reference circuit output potential and said circuit under test output potential to create an amplified difference;
  g) selecting a set limit for the amplified difference;
  h) generating an error signal each time the amplified difference is greater than the set limit;
  i) counting a number of occurrences of the error signal; and
  j) generating a failure signal when said number of occurrences exceeds said selectable limit of failures.

23. A method for testing a device under test integrated circuit (DUTIC), comprising the following steps;

a) electrically defining a window, the window being a range of potentials located between a first potential and a second potential;
  b) stimulating the DUTIC with an electrical stimulus;
  c) comparing a potential defined by the window and a potential of the DUTIC response to the electrical stimulus; and
  d) generating a signal when the potential of the DUTIC response falls outside the window.

* * * * *